(12) United States Patent
Cho (10) Patent No.: US 8,987,920 B2
(45) Date of Patent: Mar. 24, 2015

(54) WAFER SUBSTRATE BONDING STRUCTURE AND LIGHT EMITTING DEVICE COMPRISING THE SAME

(75) Inventor: Bum Chul Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 89 days.

(21) Appl. No.: 13/311,856

(22) Filed: Dec. 6, 2011

(65) Prior Publication Data

US 2012/0153329 A1 Jun. 21, 2012

(30) Foreign Application Priority Data

Dec. 16, 2010 (KR) .................. 10-2010-0129173

(51) Int. Cl.
| | |
|---|---|
| H01L 23/48 | (2006.01) |
| H01L 33/00 | (2010.01) |
| H01L 33/60 | (2010.01) |
| H01L 33/62 | (2010.01) |
| H01L 33/64 | (2010.01) |
| H01L 33/38 | (2010.01) |

(52) U.S. Cl.
CPC ............. *H01L 33/0079* (2013.01); *H01L 33/60* (2013.01); *H01L 33/62* (2013.01); *H01L 33/647* (2013.01); *H01L 33/385* (2013.01); *H01L 2924/0002* (2013.01)
USPC ................ 257/783; 257/778; 257/98; 257/99

(58) Field of Classification Search
CPC ..... H01L 33/0079; H01L 33/60; H01L 33/62; H01L 33/647

USPC ................. 257/98, 676, 777, 783, E21.697, 257/E21.704, E27.137, E27.144, E27.161, 257/778; 438/118, 119, 406, 455
See application file for complete search history.

(56) References Cited

U.S. PATENT DOCUMENTS

| | | | |
|---|---|---|---|
| 2005/0199891 A1 | 9/2005 | Kunisato et al. | |
| 2005/0211989 A1 | 9/2005 | Horio et al. | ............. 257/79 |
| 2008/0006836 A1* | 1/2008 | Lee | ............. 257/98 |
| 2008/0048206 A1* | 2/2008 | Lee et al. | ............ 257/103 |
| 2009/0008668 A1* | 1/2009 | Matsumura | ............ 257/98 |
| 2009/0261370 A1* | 10/2009 | Jeong | ............. 257/98 |
| 2010/0012955 A1 | 1/2010 | Sorg et al. | |
| 2010/0264442 A1* | 10/2010 | Lee | ............. 257/98 |
| 2011/0233598 A1* | 9/2011 | Lai | ............. 257/99 |

FOREIGN PATENT DOCUMENTS

| | | |
|---|---|---|
| CN | 1719609 | 1/2006 |
| CN | 1938904 | 3/2007 |
| CN | 101075653 | 11/2007 |
| CN | 101523598 A | 9/2009 |

(Continued)

OTHER PUBLICATIONS

Korean Notice of Allowance dated Sep. 25, 2012 issued in Application No. 10-2010-0129173.

(Continued)

*Primary Examiner* — Benjamin Sandvik
*Assistant Examiner* — Farid Khan
(74) *Attorney, Agent, or Firm* — KED & Associates LLP (57) ABSTRACT

A wafer substrate bonding structure may be provided that includes: a first substrate; and a conductive thin film which is disposed on the first substrate and includes a resin and conductive corpuscles included in the resin.

20 Claims, 7 Drawing Sheets

(56) References Cited

FOREIGN PATENT DOCUMENTS

| | | |
|---|---|---|
| CN | 101834244 | 9/2010 |
| JP | 2007-019443 A | 1/2007 |
| JP | 2007-035550 A | 2/2007 |
| JP | 2007-087979 A | 4/2007 |
| JP | 2009-253141 A | 10/2009 |

OTHER PUBLICATIONS

European Search Report for Application 11187163.8 dated Dec. 11, 2013.

Chinese Office Action for Application 201110392382.3 dated Jan. 13, 2014.

ASI "Electrically Conductive Adhesives," ASI Adhesives & Sealants, Jul. 1, 2004; retrieved from the Internet: URL: http://www.adhesivesmag.com/articles/print/electrically-conductive-adhesives-1// retrieved Dec. 3, 2013.

S.M. Sze: "Physics of Semiconductor Devices;" Feb. 2, 2007; Wiley-Interscience, New Jersey, XP055091348 pp. 190-191.

Chinese Office Action issued in related application No. 201110392382.3 dated Jun. 20, 2014.

* cited by examiner

WAFER SUBSTRATE BONDING STRUCTURE AND LIGHT EMITTING DEVICE COMPRISING THE SAME

CROSS-REFERENCE TO RELATED APPLICATION

This application claims priority from under 35 U.S.C. §119 Korean Application No. 10-2010-0129173, filed on Dec. 16, 2010, the subject matters of which are incorporated herein by reference.

BACKGROUND

1. Field

Embodiments may relate to a wafer substrate bonding structure and a light emitting device comprising the same.

2. Background

A light emitting diode (hereinafter, referred to as LED) is an energy device converting electrical energy into light energy. The LED consumes low electric power and has a long life span. Therefore, the LED can be applied at a low cost.

As the advantages of the LED are becoming important issues, the LED is now widely used in various fields. However, due to the characteristic of the LED, high power application for high output has lower efficiency than that of low power application.

Therefore, a vertical type LED is now proposed which includes an efficient electric current application structure. Unlike a horizontal type LED obtained by etching a portion of a semiconductor layer and by forming an electrode in the etched portion, the vertical type LED is formed by placing directly an electrode on the top surface and the bottom surface of a semiconductor layer. Therefore, electric current can be efficiently applied from the electrode to the semiconductor layer. Accordingly, the vertical type LED achieves greater efficiency and greater power output than those of the horizontal type LED. Also, since the vertical type LED is cooled more easily than the horizontal type LED, the vertical type LED is able to easily radiate heat generated from the operation of the vertical type LED.

Meanwhile, since the electrode should be located on the top and the bottom surfaces of the semiconductor layer in the vertical type LED, the vertical type LED requires a different manufacturing process from that of the horizontal type LED. For example, after a semiconductor layer is grown on a growth substrate like a sapphire substrate, the growth substrate should be removed before subsequent processes are performed. Here, before the growth substrate is removed, the semiconductor layer is plated in advance or is wafer-bonded in order to support the semiconductor layer having no growth substrate.

In the wafer-bonding, due to the thermal expansion coefficient difference between the growth substrate like a sapphire substrate and a new bonding substrate, a crack may be generated in the semiconductor layer during a cooling process after the wafer-bonding process, and overall structure may get bent or twisted.

Accordingly, there is a necessity of developing a wafer substrate bonding structure, which is suitable to be applied to a wafer-bonding method of the vertical type LED, and of developing a light emitting diode using the same.

SUMMARY

One embodiment is a wafer substrate bonding structure including: a first substrate; and a conductive thin film which is disposed on the first substrate and includes a resin and conductive corpuscles included in the resin.

Another embodiment is a light emitting device including: a wafer substrate bonding structure including a conductive thin film which is disposed on a substrate and includes a resin and conductive corpuscles; a light emitting structure including a first semiconductor layer, an active layer and a second semiconductor layer, all of which are disposed on the wafer substrate bonding structure; and an electrode layer which is disposed on the light emitting structure.

Further another embodiment is a light emitting device including: a light emitting structure including a first semiconductor layer, an active layer and a second semiconductor layer, wherein the first semiconductor layer has an exposed area; a first electrode which is disposed on the exposed area of the first semiconductor layer; a second electrode which is disposed on the second semiconductor layer; and a wafer substrate bonding structure contacting with the first electrode and the second electrode and including a conductive thin film which includes a resin and conductive corpuscles.

BRIEF DESCRIPTION OF THE DRAWINGS

Arrangements and embodiments may be described in detail with reference to the following drawings in which like reference numerals refer to like elements and wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

FIGS. 1 to 4 are views showing a configuration of a wafer substrate bonding structure according to an embodiment.

Figure 1:
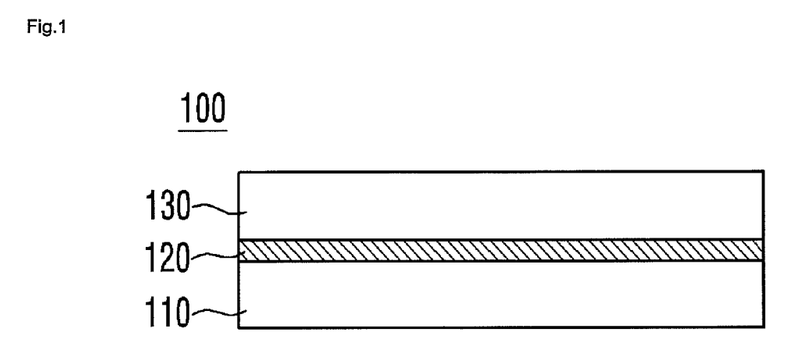
FIGS. 1 to 4 are views showing a configuration of a wafer substrate bonding structure according to an embodiment.

Referring to FIG. 1, a wafer substrate bonding structure 100 according to a first embodiment may be formed to include a first substrate 110, a conductive thin film 120 and a second substrate 130, all of which are sequentially stacked.

The first substrate 110 may be a conductive substrate. For example, the first substrate 110 may be formed of a material such as ZnO, $SiO_2$ and $SnO_2$ and the like.

The conductive thin film 120 according to the embodiment may have a form in which a plurality of conductive corpuscles are distributed in a resin. The conductive corpuscle may have a diameter of several micrometers. For example, the conductive corpuscle may have a shape in which a monodisperse special plastic particle having a diameter of several micrometers is plated with Ni, Au or Cu in the form of a thin film having a thickness of about 100 nm. However, it is desirable that the conductive corpuscle should have a shape in which the monodisperse special plastic particle is plated with an alloy including a material having a low melting point, for example, Au—Sn. When the conductive corpuscle plated with an alloy including a material having a low melting point is included in the conductive thin film 120, the conductive thin film 120 is not bent or twisted during a cooling process. Besides, during a bonding process, the conductive corpuscle is distorted and melted to stick to each other. As a result, a heat radiating characteristic may be enhanced and an adhesive strength may be more increased. The resin may include at least one of a thermosetting resin, a thermoplastic resin and a curing agent. An epoxy resin may be used as the thermosetting resin. An acrylic resin may be used as the thermoplastic resin. The conductive thin film may be, for example, an anisotropic conductive film (ACF).

The second substrate 130 may be stacked on the conductive thin film 120. The second substrate 130 may be either a predetermined substrate (for example, a sapphire substrate and the like) on which a device structure can be formed or a substrate having a thermal expansion coefficient different from that of the first substrate 110, such as a semiconductor layer which is a portion of the device structure, and the like.

Since the first substrate 110 is formed of a material having different properties from those of the material of the second substrate 130, the first and the second substrates 110 and 130 have mutually different thermal expansion coefficients. As the thermal expansion coefficient difference becomes larger, it becomes more difficult to bond them. For example, it is assumed that the thermal expansion coefficient of the first substrate 110 is greater than that of the second substrate 130. Then, when a bonding process of the first substrate 110 and the second substrate 130 is performed at a high temperature, the first substrate 110 relatively more expands than the second substrate 130. Therefore, the first substrate 110 or the second substrate 130 may be damaged. However, according to the embodiment, since the conductive thin film 120 is included between the first substrate 110 and the second substrate 130, and the conductive thin film 120 is able to function as a bond between the first substrate 110 and the second substrate 130, the bonding process of the first substrate 110 and the second substrate 130 can be performed at a low temperature. Accordingly, since the bonding process is performed at a low temperature even though the thermal expansion coefficient difference between the first substrate 110 and the second substrate 130 is large, the expansion difference between the first and the second substrates 110 and 130 is insignificant in their bonding and the first and the second substrates 110 and 130 can be securely bonded to each other. Further, since the first and the second substrates 110 and 130 are bonded with the conductive thin film 120 placed therebetween, large-area bonding can be performed and a contact resistance can be hereby considerably reduced. Meanwhile, the resin constituting the conductive thin film 120 may relieve stress between the first substrate 110 and the second substrate 130.

Figure 2:
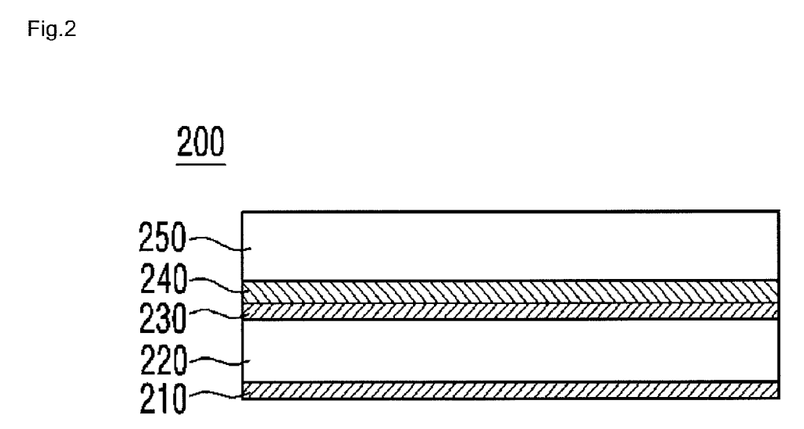

In the next place, referring to FIG. 2, a wafer substrate bonding structure 200 according to a second embodiment may be formed to include a first metal layer 210, a first substrate 220, a second metal layer 230, a conductive thin film 240 and a second substrate 250, all of which are sequentially stacked.

According to the second embodiment, the first substrate 220 may be a p-type semiconductor substrate or an n-type semiconductor substrate. The conductive thin film 240 and the second substrate 250 are formed of the same materials as those of the conductive thin film 120 and the second substrate 130 respectively. Therefore, detailed descriptions thereof will be omitted.

The second metal layer 230 according to the second embodiment helps the first substrate 220, i.e., a semiconductor substrate to come in ohmic contact with the conductive thin film 240. That is, the second metal layer 230 minimizes the potential barrier of a carrier of the first substrate 220, i.e., the semiconductor substrate and reduces the contact resistance between the first substrate 220 and the conductive thin film 240. The first metal layer 210 and the second metal layer 230 may be formed of an alloy including Cr, Ni and Au, Ag, an alloy including Ti and Ag, and the like. The first metal layer 210 and the second metal layer 230 may be formed of the same material or may be formed of mutually different materials.

Figure 3:
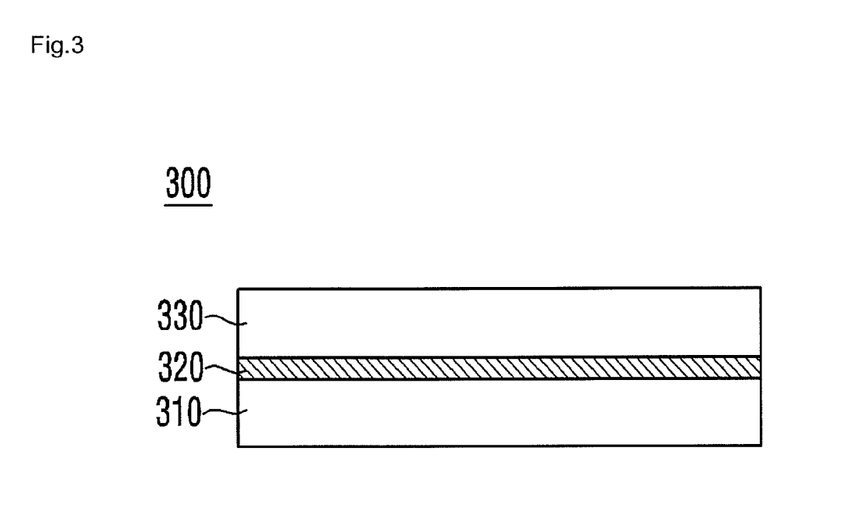

Referring to FIG. 3, a wafer substrate bonding structure 300 according to a third embodiment may include a first substrate 310, a conductive thin film 320 and a second substrate 330, all of which are sequentially stacked.

According to the third embodiment, the first substrate 310 may be a p-type semiconductor substrate or an n-type semiconductor substrate. Since the second substrate 330 is the same as the second substrates 130 and 250 shown in FIGS. 1 and 2, the description thereof will be omitted.

It is inevitable that a contact resistance occurs between the first substrate 310 and the conductive thin film 320. Surface metal of the conductive corpuscle included in the conductive thin film 320 according to the third embodiment is formed of a material enabling the first substrate 310 and the conductive thin film 320 to come in ohmic contact with each other. According to this, since the ohmic contact is formed between the first substrate 310 and the conductive thin film 320, the wafer substrate bonding structure 300 according to the third embodiment does not require the second metal layer 230 of the wafer substrate bonding structure 200 in FIG. 2, which helps the first substrate 220 to come in ohmic contact with the conductive thin film 240. That is, according to the third embodiment, without a separate component, the first substrate 310 and the conductive thin film 320 are able to come in ohmic contact with each other, but also the first substrate 310 and the second substrate 330 are able to be bonded to each other at a low temperature.

For example, when it is assumed that a work function of the first substrate 310 is "fs" and a work function of the surface metal of the conductive corpuscle included in the conductive thin film 320 is "fm", the surface metal of the conductive corpuscle may be selected in such a relation that when the first substrate 310 is an n-type semiconductor substrate, "fm"<"fs", and when the first substrate 310 is a p-type semiconductor substrate, "fm">"fs".

Figure 4:
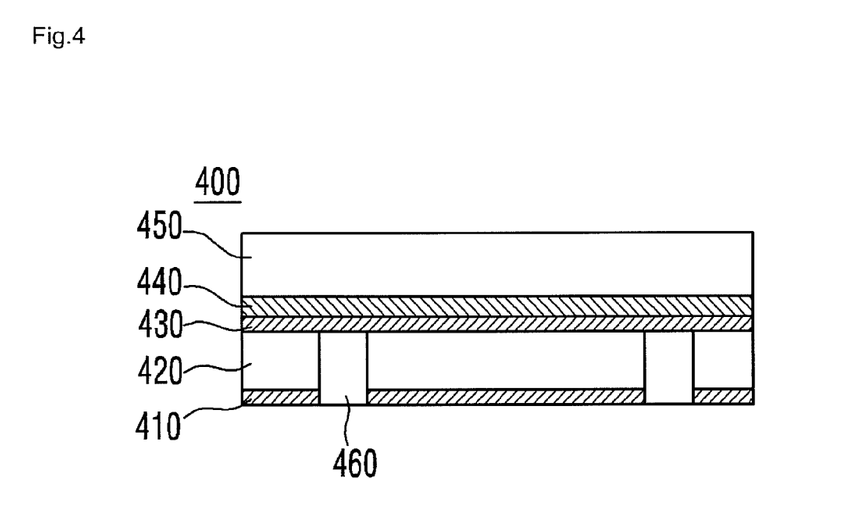

Lastly, referring to FIG. 4, a wafer substrate bonding structure 400 according to a fourth embodiment may include a first metal layer 410, a first substrate 420, a second metal layer 430, a conductive thin film 440, a second substrate 450 and an electrifier 460, all of which are sequentially stacked. The electrifier 460 penetrates the first substrate 420 and electrically connects the first metal layer 410 with the second metal layer 430.

The first substrate 420 according to the fourth embodiment may be a nonconductive substrate. Therefore, the electrifier 460 is required in order that the first metal layer 410 and the second metal layer 430 are electrically connected with each other with the first substrate 420 placed therebetween. To this end, the electrifier 460 may be formed of a conductive material. Since other components, i.e., the conductive thin film 440 and the second substrate 450 are the same as those of the first and the second embodiments, the detailed descriptions will be omitted.

A manufacturing process of the wafer substrate bonding structure 400 according to the fourth embodiment will be described as follows.

First, the first metal layer 410 and the first substrate 420 are deposited and at least a portion of the first substrate 420 is removed by an etching process such that the first metal layer 410 is exposed through the removed portion. Then, the electrifier 460 is formed by forming a conductive metal in the exposed portion of the first metal layer 410, and then the second metal layer 430 is formed to cover the first substrate 420 and the electrifier 460. Subsequently, the conductive thin film 440 and the second substrate 450 are formed on the second metal layer 430. Consequently, the wafer substrate bonding structure 400 according to the fourth embodiment is completed.

FIGS. 5a to 5e are cross sectional views for describing a manufacturing process of a light emitting device by using the wafer substrate bonding structure according to the embodiment. A manufacturing process of a vertical type light emitting device will be described with reference to FIGS. 5a to 5e.

Figure 5A:
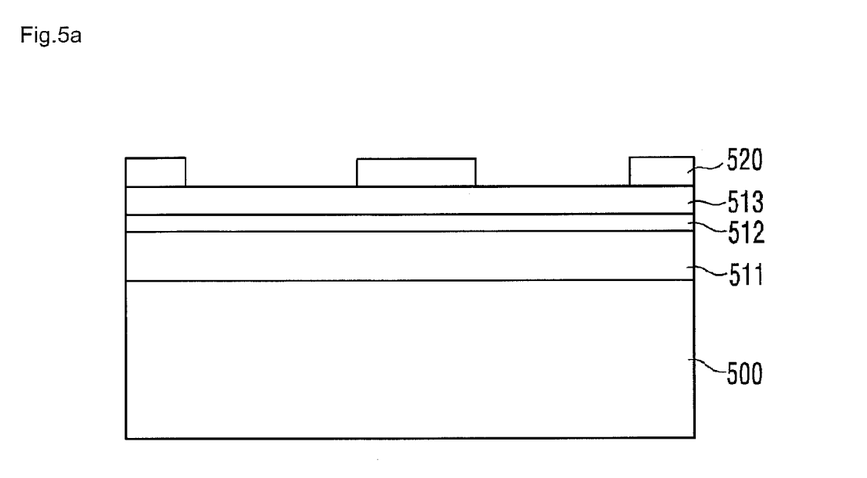
FIGS. 5a to 5e are views describing a manufacturing process of a light emitting device according to the embodiment.

First, referring to FIG. 5a, after a first semiconductor layer 511, an active layer 512 and a second semiconductor layer 513 are sequentially grown on a growth substrate 500, an ohmic layer 520 is formed on the second semiconductor layer 513. The growth substrate 500 may be a sapphire substrate. The first semiconductor layer 511 and the active layer 512 may be an N—GaN layer and a P—GaN layer respectively. The active layer 512 may be a multi-quantum well (MQW) having a plurality of quantum well structures. The ohmic layer 520 may be formed of a material, for example, SiO$_2$ and the like.

Figure 5B:
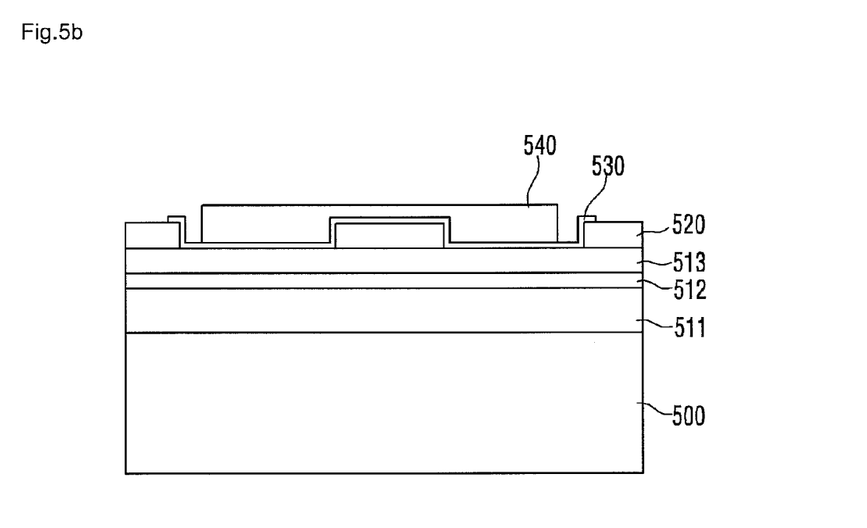

Referring to FIG. 5b, an insulation layer 530 is formed on the ohmic layer 520. A reflective layer 540 is formed on the insulation layer 530. The insulation layer 530 prevents the semiconductor layers 511 and 513 from being short-circuited due to the reflective layer 540. The reflective layer 540 may be formed of a material such as Ag, Ni or Al and the like. The reflective layer 540 may have a central portion thicker than a peripheral portion.

Figure 5C:
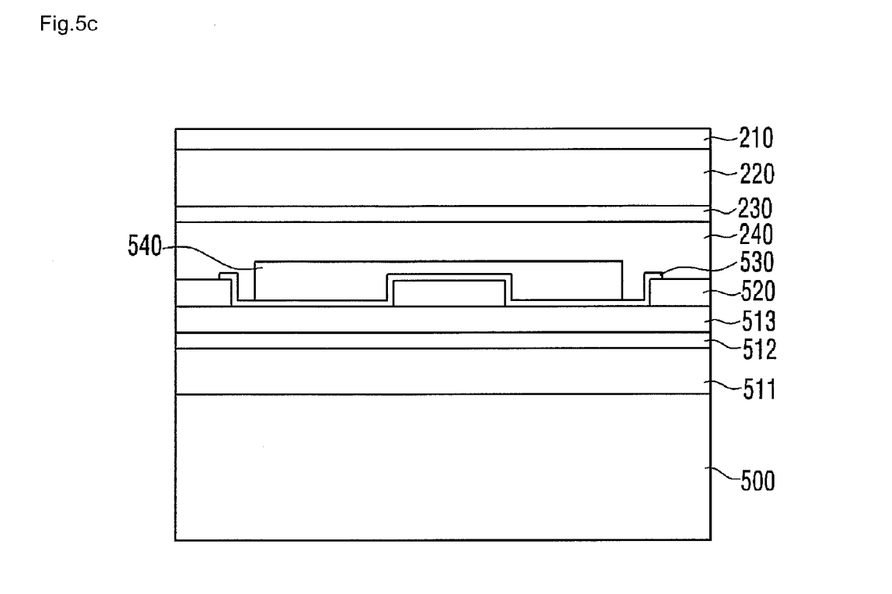

Referring to FIG. 5c, the wafer substrate bonding structure 200 according to the embodiment is formed to cover the reflective layer 540 and the insulation layer 530. The wafer substrate bonding structure 200 may include the first metal layer 210, the first substrate 220, the second metal layer 230 and the conductive thin film 240, all of which are sequentially stacked. The wafer substrate bonding structure 200 is formed on the reflective layer 540 in such a manner that the conductive thin film 240 contacts with the reflective layer 540. The drawing shows only the wafer substrate bonding structure 200 of FIG. 2 as a wafer substrate bonding structure included in the light emitting device. The wafer substrate bonding structures shown in FIGS. 1, 3 and 4 may be also used. According to the embodiment, thanks to the conductive thin film 240, the bonding process can be performed at a low temperature and the stress according to the thermal expansion coefficient difference can be relieved by the resin of the conductive thin film 240 though heat is added. While the drawing show that the conductive thin film 240 contacts with the reflective layer 540, a conductive or nonconductive substrate may be further formed on the conductive thin film 240. In other words, the conductive or the nonconductive substrate may be further formed between the conductive thin film 240 and the reflective layer 540.

Figure 5D:
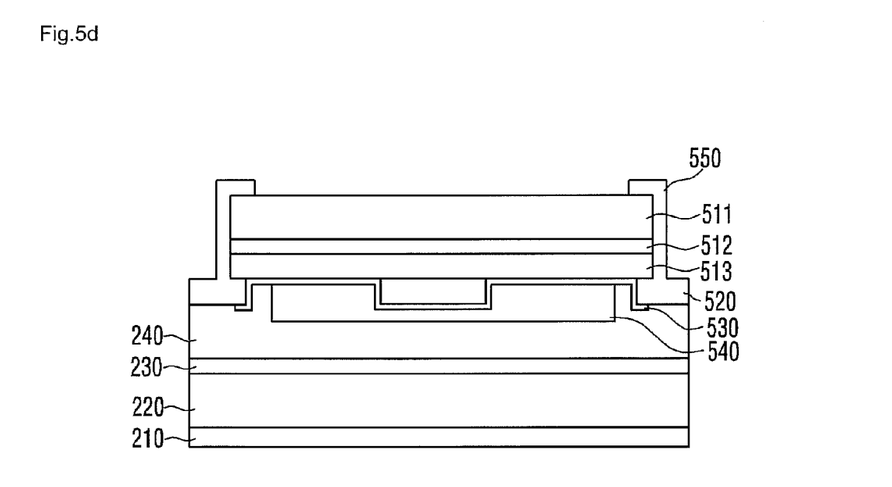

Referring to FIG. 5d, after the growth substrate 500 is removed by performing a laser lift off (LLO) process, a pattern for forming a light emitting structure is formed by an etching process. Then, a protective layer 550 is formed to cover the lateral surface of the light emitting structure. The protective layer 550 may be formed of a material, for example, SiO$_2$ and the like.

Figure 5E:
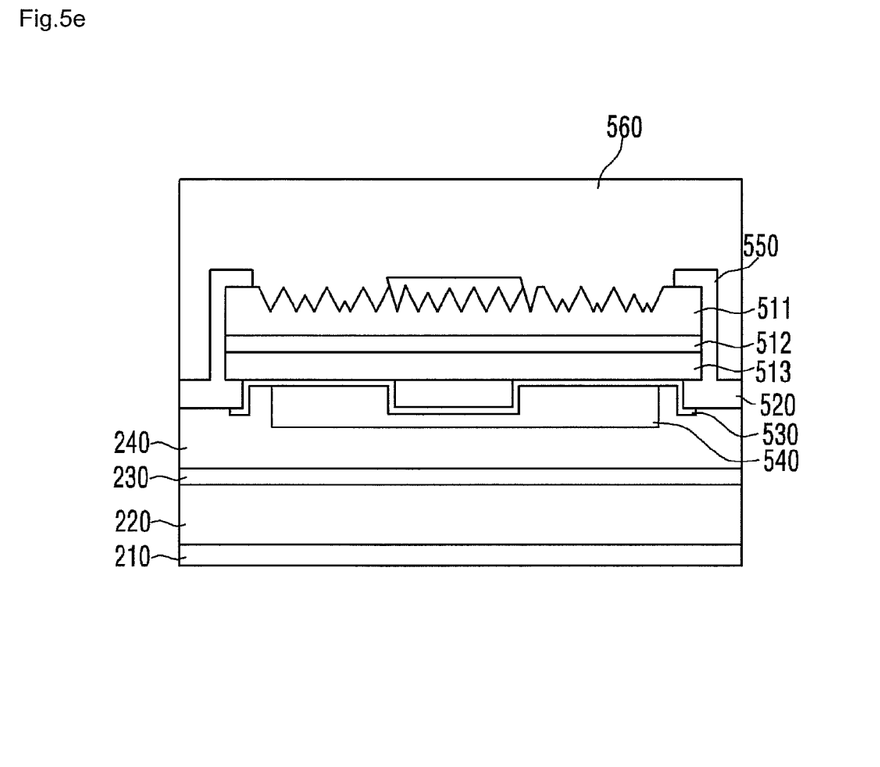

Referring to FIG. 5e, a light extraction structure, for example, a texturing structure may be formed on the first semiconductor layer 511 so as to improve light emission efficiency. An electrode layer 560 may be also formed on at least a portion of the first semiconductor layer 511.

Figure 6A:
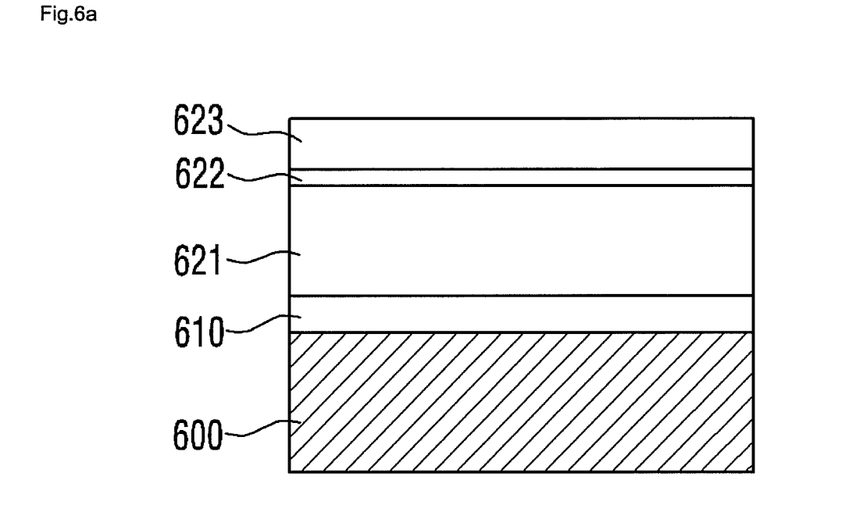
FIGS. 6a to 6c are views describing a manufacturing process of the light emitting device by using the wafer substrate bonding structure according to the embodiment.
Figure 6B:
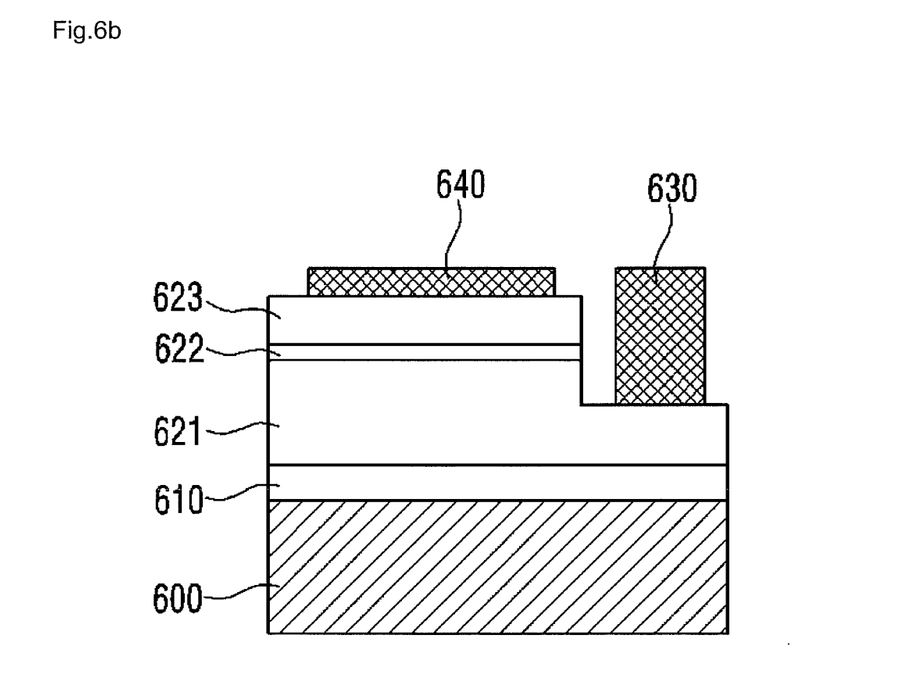
Figure 6C:
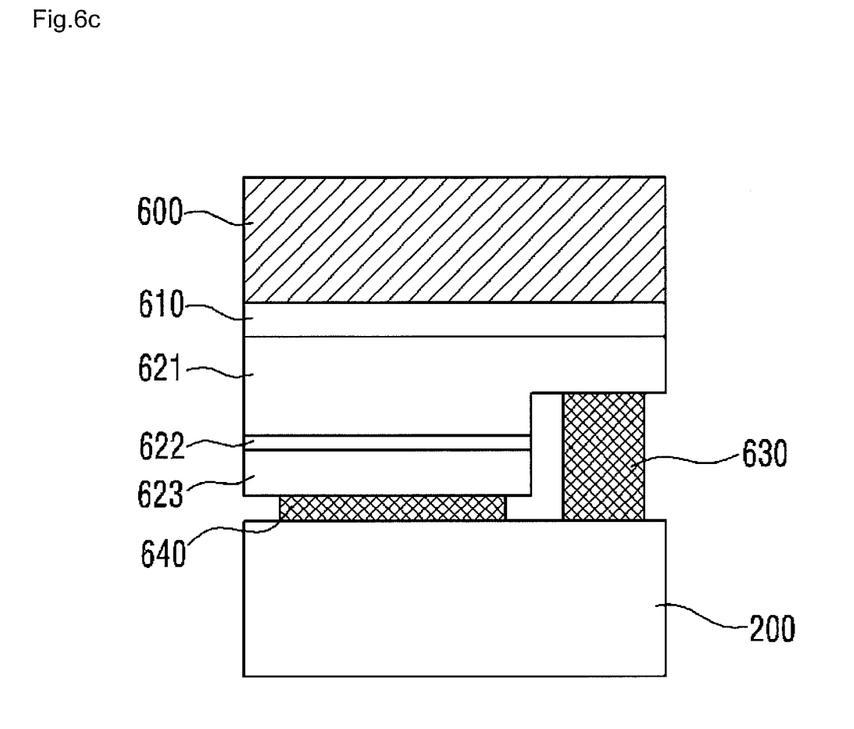

FIGS. 6a to 6c are cross sectional views for describing a manufacturing process of the light emitting device by using the wafer substrate bonding structure according to the embodiment. A manufacturing process of a flip-chip type light emitting device will be described with reference to FIGS. 6a to 6c.

Referring to FIG. 6a, a buffer layer 610, a first semiconductor layer 621, an active layer 622 and a second semiconductor layer 623 are formed on a growth substrate 600.

The buffer layer 610 buffers the lattice mismatch between the growth substrate 600 and an Epi layer and may be formed of a non-doped GaN layer. The growth substrate 600 may be a sapphire substrate. The first semiconductor layer 621 and the active layer 623 may be an N—GaN layer and a P—GaN layer respectively. The active layer 622 may be a multi-quantum well (MQW) having a plurality of quantum well structures.

Referring to FIG. 6b, after an etching process is performed such that a portion of the first semiconductor layer 621 is exposed, a first electrode 630 and a second electrode 640 are formed on the exposed portion of the first semiconductor layer 621 and the second semiconductor layer 623 respectively.

Meanwhile, though not shown in the drawings, a reflective layer may be further formed on the second semiconductor layer 623 before the second electrode 640 is formed on the second semiconductor layer 623. The reflective layer is able to not only come in ohmic contact with the second semiconductor layer 623 but also reflect light generated from the active layer 622 toward the first semiconductor layer 621.

Referring to FIG. 6c, the flip-chip type light emitting device is completed by bonding the first electrode 630 and the second electrode 640 to the wafer substrate bonding structure 200. A description of a manufacturing process of the wafer substrate bonding structure 200 is the same as the foregoing description and will be omitted. While the drawing shows only the wafer substrate bonding structure 200 of FIG. 2 as a wafer substrate bonding structure, the wafer substrate bonding structures shown in FIGS. 1, 3 and 4 may be also used. Meanwhile, it is recommended that an insulation layer (not shown) should be formed on the wafer substrate bonding structure 200 for the purpose of insulation between the first electrode 630 and the second electrode 640.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A light emitting device comprising:
   a substrate;
   a conductive thin film disposed on the substrate;
   a reflective layer disposed on the conductive thin film;

a first electrode layer disposed on the conductive thin film;
a light emitting structure including a first semiconductor layer, an active layer and a second semiconductor layer disposed on the reflective layer; and
an insulation layer disposed between the reflective layer and the second semiconductor layer of the light emitting structure;
wherein the conductive thin film includes a resin and conductive corpuscles,
wherein the reflective layer is electrically insulated from the light emitting structure by the insulation layer, and
wherein the conductive thin film includes a first area on which the reflective layer is disposed and a second area that electrically connects to the first electrode layer,
wherein the first electrode layer includes a first electrode portion that is disposed between the reflective layer and the light emitting structure, and a second electrode portion that is disposed on a circumference area of the conductive thin film, and
the insulation layer is a continuous insulation layer from the second electrode portion to the first electrode portion, the continuous insulation layer including:
a first insulation portion between the first electrode portion and the reflective layer, wherein the first electrode portion is between the second semiconductor layer and the first insulation portion, and
a second insulation portion between the second semiconductor layer and the reflective layer.

2. The light emitting device of claim 1, further comprising a first metal layer disposed on the substrate, and a second metal layer disposed between the substrate and the conductive thin film.

3. The light emitting device of claim 1, wherein the second area of the conductive thin film is it the circumference area of the conductive thin film.

4. The light emitting device of claim 1, wherein the reflective layer comprises a recess.

5. The light emitting device of claim 4, wherein a part of the first electrode portion of the first electrode layer is disposed on the recess.

6. The light emitting device of claim 1, wherein a part of the conductive thin film is disposed between the reflective layer and the second portion of the first electrode layer.

7. The light emitting device of claim 1, further comprising a protective layer disposed at a lateral surface of the light emitting structure.

8. A light emitting device comprising:
a substrate;
a conductive thin film disposed on the substrate;
a reflective layer on the conductive thin film;
a first electrode layer disposed on the conductive thin film;
a light emitting structure including a first semiconductor layer, an active layer and a second semiconductor layer; and
an insulation layer disposed between the conductive thin film and the light emitting structure;
wherein the second semiconductor layer includes a texturing structure,
wherein the conductive thin film is electrically insulated from the light emitting structure by the insulation layer, and the conductive thin film connects with the light emitting structure through the first electrode layer,
wherein the first electrode layer includes a first electrode portion that is disposed between the reflective layer and the light emitting structure, and a second electrode portion that is disposed on a circumference area of the conductive thin film, and the insulation layer is a continuous insulation layer from the second electrode portion to the first electrode portion, the continuous insulation layer including:
a first insulation portion between the first electrode portion and the reflective layer, wherein the first electrode portion is between the second semiconductor layer and the first insulation portion, and
a second insulation portion between the second semiconductor layer and the reflective layer.

9. The light emitting device of claim 8, wherein the conductive thin film does not connect with the light emitting structure directly by the insulation layer.

10. The light emitting device of claim 8, further comprising a first metal layer disposed on the substrate, and a second metal layer disposed between the substrate and the conductive thin film.

11. The light emitting device of claim 8, wherein the reflective layer includes a recess.

12. A light emitting device comprising:
a substrate;
a metal layer disposed on the substrate;
a conductive thin film disposed on the metal layer;
a reflective layer disposed on the conductive thin film;
an insulation layer disposed on the conductive thin film and the reflective layer;
a first electrode layer disposed on the conductive thin film and the insulation layer;
a first semiconductor layer disposed on the insulation layer and the first electrode layer;
an active layer disposed on the first semiconductor layer;
a second semiconductor layer disposed on the active layer;
a protective layer disposed at a lateral surface of the first semiconductor layer, the active layer and the second semiconductor layer;
a second electrode layer disposed on the second semiconductor layer; and
a texturing structure disposed on the second semiconductor layer,
wherein the first electrode layer includes a first electrode portion that is disposed between the reflective layer and the light emitting structure, and a second electrode portion that is disposed on a circumference area of the conductive thin film, and
the insulation layer is a continuous insulation layer from the second electrode portion to the first electrode portion, the continuous insulation layer including:
a first insulation portion between the first electrode portion and the reflective layer, wherein the first electrode portion is between the second semiconductor layer and the first insulation portion, and
a second insulation portion between the second semiconductor layer and the reflective layer.

13. The light emitting device of claim 12, further comprising another metal layer disposed on a bottom side of the substrate.

14. The light emitting device of claim 12, wherein the conductive thin film comprises a first area on which the reflective layer is disposed and a second area on which the first electrode layer is disposed.

15. The light emitting device of claim 14, wherein the second area is the circumference area of the conductive thin film.

16. The light emitting device of claim 12, wherein the reflective layer comprises a recess.

17. The light emitting device of claim 16, wherein a part of the first electrode portion of the first electrode layer is disposed on the recess.

18. The light emitting device of claim 12, wherein the conductive thin film does not connect with the first semiconductor layer by the insulation layer.

19. The light emitting device of claim 1, wherein a portion of the continuous insulation layer is between the conductive thin film and the second electrode portion at the circumference area of the conductive thin film.

20. The light emitting device of claim 8, wherein a portion of the continuous insulation layer is between the conductive thin film and the second electrode portion at the circumference area of the conductive thin film.

* * * * *